US008998590B2

(12) United States Patent
Shintani

(10) Patent No.: US 8,998,590 B2
(45) Date of Patent: Apr. 7, 2015

(54) COOLING APPARATUS FOR ELECTRONIC DEVICE

(75) Inventor: Dai Shintani, Osaka (JP)

(73) Assignee: Panasonic Intellectual Property Management Co., Ltd., Osaka (JP)

(*) Notice: Subject to any disclaimer, the term of this patent is extended or adjusted under 35 U.S.C. 154(b) by 459 days.

(21) Appl. No.: 13/425,442

(22) Filed: Mar. 21, 2012

(65) Prior Publication Data

US 2012/0244024 A1 Sep. 27, 2012

(30) Foreign Application Priority Data

Mar. 23, 2011 (JP) ................................. 2011-063844
Feb. 10, 2012 (JP) ................................. 2012-027288

(51) Int. Cl.
*F04D 33/00* (2006.01)
*H05K 7/20* (2006.01)

(52) U.S. Cl.
CPC ............ *H05K 7/20172* (2013.01); *F04D 33/00* (2013.01)

(58) Field of Classification Search
CPC ........................... F04D 33/00; H05K 7/20172
USPC ................... 417/410.2, 436; 361/688
See application file for complete search history.

(56) References Cited

U.S. PATENT DOCUMENTS 2,728,298 A * 12/1955 Shafer ........................... 417/343
4,498,851 A * 2/1985 Kolm et al. ................. 417/410.2
6,116,517 A * 9/2000 Heinzl et al. ................... 239/101
2011/0064594 A1 3/2011 Wada et al.
2011/0120679 A1* 5/2011 Tanaka .......................... 165/121
2012/0134858 A1 5/2012 Wada et al.

FOREIGN PATENT DOCUMENTS

| JP | H03-061361 U | 6/1991 |
| JP | H10-174406 A | 6/1998 |
| JP | 2002-130198 A | 5/2002 |
| JP | 2004-64991 A | 2/2004 |
| WO | 2009/034956 A1 | 3/2009 |

OTHER PUBLICATIONS

Office Action from the corresponding Japanese Patent Application No. 2012-027288 issued on Sep. 2, 2014.

* cited by examiner

*Primary Examiner* — Charles Freay
*Assistant Examiner* — Philip Stimpert
(74) *Attorney, Agent, or Firm* — Shinjyu Global IP

(57) ABSTRACT

A cooling apparatus includes a base member, a flat piezoelectric actuator, at least one expansion mechanism, and a blade member. The flat piezoelectric actuator is configured to be connected at one end to the base member. At least one expansion mechanism is configured to be connected to the other end of the piezoelectric actuator and pivot by the swinging of the piezoelectric actuator. The blade member is configured to be connected to the expansion mechanism and swing by the pivoting of the expansion mechanism. The blade member performs a fanning action by the swinging of the piezoelectric actuator and the pivoting of the expansion mechanism if AC power is applied to the piezoelectric actuator.

7 Claims, 1 Drawing Sheet

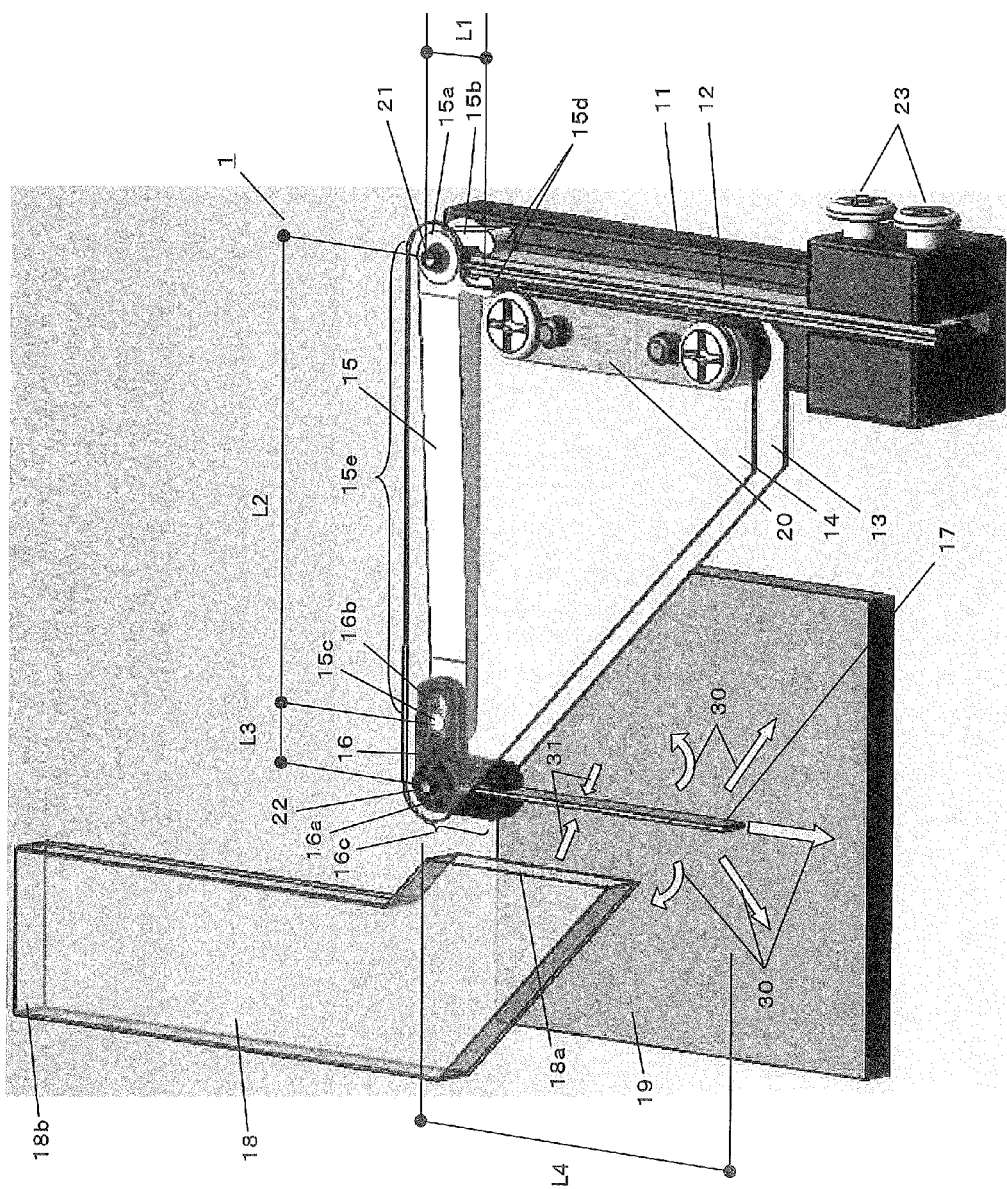

COOLING APPARATUS FOR ELECTRONIC DEVICE

CROSS-REFERENCE TO RELATED APPLICATIONS

This application claims priority to Japanese Patent Application No. 2011-063844, filed on Mar. 23, 2011 and Japanese Patent Application No. 2012-027288, filed on Feb. 10, 2012. The entire disclosure of Japanese Patent Application No. 2011-063844 and Japanese Patent Application No. 2012-027288 are hereby incorporated herein by reference.

BACKGROUND

1. Technical Field

The technology disclosed herein relates to an apparatus for eliminating heat generated by electronic parts and electronic devices.

2. Background Information

As electronic parts are mounted in higher density and processing speeds have risen in recent years, the amount of heat generated by individual devices increases. As a result, with some devices, their performance has begun to be affected by heat generation. Blowing or drawing air with a cooling fan has been done in the past as a way to lessen this heat generation. A cooling fan creates a flow of air by rotating blades. For example, brushless motors and the like have been used as the drive source for this rotation (see Japanese Laid-Open Patent Application H10-174406).

SUMMARY

With a rotation drive source powered by a conventional motor, magnets are provided in the interior, so electronic devices can be affected by magnetic flux leakage. Meanwhile, it is desirable to make a fan thinner in order to produce a more compact electronic device. However, if a fan is made thinner, there is the risk that the motor ends up being smaller and not enough rotational torque is generated, so that the required amount of cooling airflow is not obtained.

The present technology was conceived in light of this, and it is an object thereof to provide a cooling apparatus for electronic parts and electronic devices that is not affected by magnetic flux leakage and can be made thinner.

With the present technology, the cooling apparatus comprises a base member, a flat piezoelectric actuator, at least one expansion mechanism, and a blade member. The flat piezoelectric actuator is configured to be connected at one end to the base member. At least one expansion mechanism is configured to be connected to the other end of the piezoelectric actuator and pivot by the swinging of the piezoelectric actuator. The blade member is configured to be connected to the expansion mechanism and swing by the pivoting of the expansion mechanism. The blade member performs a fanning action by the swinging of the piezoelectric actuator and the pivoting of the expansion mechanism if AC power is applied to the piezoelectric actuator.

With the present technology, electronic parts and electronic devices can be cooled without any magnetic flux leakage despite an extremely thin design.

BRIEF DESCRIPTION OF THE DRAWINGS

Referring now to the attached drawing, which form a part of this original disclosure:

FIG. 1 is an oblique view of a cooling apparatus.

DETAILED DESCRIPTION OF EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

The cooling apparatus pertaining to an embodiment of the present technology will be described. The following embodiments are embodiments of the present technology, but the present technology is not limited to or by these embodiments.

Embodiment

1: Configuration 1-1: Overview of Cooling Apparatus

FIG. 1 is an oblique view of the cooling apparatus pertaining to an embodiment of the present technology. A cooling apparatus 1 is constituted by a base member 11, a bimorph 12 (an example of a piezoelectric actuator), an expansion lever 15 (an example of an expansion mechanism), a blade lever 16, a blade member 17, a lower cover 13, and an upper cover 14. One end of the bimorph 12 is fixed to the base member 11. The expansion lever 15 holds the end on the opposite side from the one end of the bimorph 12 (the fixed end). The blade lever 16 is connected to the expansion lever 15. The blade member 17 is fixed at one end to the blade lever 16. The lower cover 13 and the upper cover 14 hold the expansion lever 15 and the blade lever 16 so that the latter two can be driven.

The various components will now be described in detail.

1-2: Configuration of Cooling Apparatus

The bimorph 12 is a ceramic actuator. A ceramic actuator is produced by sandwiching a shim between two piezoelectric elements and joining these together. When a charge is applied to the ceramic actuator, one of the piezoelectric elements of the ceramic actuator expands, and the other piezoelectric element of the ceramic actuator contracts. Consequently, the free end side of the ceramic actuator is displaced. Here, the free end of the ceramic actuator swings by applying an AC charge to the ceramic actuator. If the bimorph 12 is a parallel type, the amount of displacement by this motion is expressed by the following Formula 1.

$$u_0 = 3 \cdot d_{31} \left(\frac{l}{t}\right)^2 \cdot \left(1 + \frac{t_s}{t}\right) \cdot V \cdot \alpha [m] \qquad \text{[Formula 1]}$$

Here, $U_0$ is the unloaded displacement, $d_{31}$ is an equivalent piezoelectric constant, l is the displaceable bimorph length, t is the total bimorph thickness, $t_s$ is the shim thickness, V is the applied voltage, and $\alpha$ is a nonlinear correction coefficient.

For example, when $d_{31}$=−2.62 E-10 m/V, l=19 mm, t=0.8 mm, $t_s$=0.2 mm, V=100 V, and $\alpha$=2, $U_0$≈0.11 mm. The applied voltage is AC. In this case, the free end of the bimorph 12 moves over a range of ±0.11 mm.

One end of the bimorph 12 is fixed to the base member 11 by a fixing member, such as screws 23. Here, the bimorph 12 is fixed by being held with screws 23 as shown in FIG. 1, but as long as one end of the bimorph 12 can be fixed, any fixing method may be employed. For example, fixing may be accomplished by fastening with screws, bonding with an adhesive agent, or the like.

The base member 11 is preferably constituted by an insulator so that it may come into contact with the bimorph 12.

The expansion lever 15 amplifies (expands) the vibration of the bimorph 12 and transmits it to the blade member 17. The expansion lever 15 is supported by the base member 11 rotatably around a rotary shaft 15a. A bimorph clamper 15b is provided to the expansion lever 15. The expansion lever 15 holds the free end of the bimorph 12 with the bimorph clamper 15b. The bimorph clamper 15b holds the bimorph 12 between two cylinders 15d so that displacement of the bimorph 12 can be efficiently transferred to the expansion lever 15. More precisely, the two cylinders 15d are formed on the bimorph clamper 15b so as to be parallel to the rotary shaft 15a. Also, the two cylinders 15d are formed on the bimorph clamper 15b so as to be opposite each other. These two cylinders 15d clamp the free end of the bimorph 12.

Since the expansion lever 15 comes into contact with the bimorph 12, it is constituted by an insulator. Also, the expansion lever 15 is preferably made of an elastic material, such as an elastomer, so that no displacement loss, noise, or the like will occur between the expansion lever 15 and the bimorph 12. The bimorph 12 is preferably clamped by this expansion lever 15.

The expansion lever 15 further has a first arm 15e. A connecting shaft 15c is provided at one end (the distal end) of this first arm 15e. Here, the first arm 15e is formed so that the length L2 from the rotary shaft 15a to the connecting shaft 15c will be greater than the length L1 from the rotary shaft 15a to the bimorph clamper 15b. More specifically, in this example, L2/L1 is set to a length of approximately 3.8 times, so the amount of displacement of the free end of the bimorph 12, such as a displacement of ±0.11 mm, is expanded to a displacement of ±0.11×3.8≈±0.42 mm at the position of the connecting shaft 15c of the expansion lever 15.

The length L1 from the rotary shaft 15a to the bimorph clamper 15b is the distance between the axis of the rotary shaft 15a (the axis of a shaft 21 (discussed below)) and the portion of the bimorph clamper 15b where the cylinders 15d touches the bimorph 12. The length L2 from the rotary shaft 15a to the connecting shaft 15c is the distance between the axis of the rotary shaft 15a (the axis of a shaft 21 (discussed below)) and the axis of the connecting shaft 15c.

The blade lever 16 is supported between the lower cover 13 and the upper cover 14 so that it can rotate around a rotary shaft 16a. The blade lever 16 has a connecting slot 16b. The connecting shaft 15c of the expansion lever 15 fits into the connecting slot 16b. The blade lever 16 further has a second arm 16c. The blade member 17 is fixed to one end (the distal end) of the second arm 16c.

The blade member 17 is a member that generates an air flow for cooling the surface layer of a heat generator 19. The blade member 17 is disposed opposite the bimorph 12. More specifically, it is disposed substantially parallel to the bimorph 12. Also, the bimorph 12 is disposed so that the displaced plane of the blade member 17 is the same as, or parallel to, the displaced plane of the bimorph 12. The phrase "the displaced plane of the blade member 17" here refers to the plane which the blade member 17 vibrates. The "displaced plane of the bimorph 12" refers to the plane which the bimorph 12 vibrates. More specifically, the displaced plane of the blade member 17 is a plane that includes the trajectory of the swinging end (the distal end) of the blade member 17. The displaced plane of the bimorph 12 is a plane that includes the trajectory of the swinging part of the bimorph 12.

With the above cooling apparatus 1, displacement of the bimorph 12 that has been expanded by the expansion lever 15 is transmitted to the blade member 17. In this example, the length L4 from the rotary shaft 16a to the distal end of the blade member 17 is set to be approximately six times (=L4/L3) the length L3 between the rotary shaft 16a and the connecting slot 16b, so the distal end of the blade member 17 is displaced over a range of ±0.42×6≈±2.52 mm, for example.

The length L3 between the rotary shaft 16a and the connecting slot 16b is the distance between the axis of the rotary shaft 16a (the axis of a shaft 22 (discussed below)) and the axis of the connecting shaft 15c disposed in the connecting slot 16b. Also, the length L4 from the rotary shaft 16a to the distal end of the blade member 17 is the distance from the axis of the rotary shaft 16a (the axis of the shaft 22 (discussed below)) to the distal end of the blade member 17.

The expansion lever 15 and the blade lever 16 are disposed between the lower cover 13 and the upper cover 14. The lower cover 13 and the upper cover 14 rotatably support the expansion lever 15 and the blade lever 16. Also, the lower cover 13 and the upper cover 14 hold a spacing member 20. This spacing member maintains a specific spacing between the lower cover 13 and the upper cover 14. The spacing member 20 here is fastened by fixing members, such as screws, to the base member 11.

In this example, the shaft 21 is fitted to the rotary shaft 15a of the expansion lever 15. Also, the shaft 22 is fitted to the rotary shaft 16a of the blade lever 16. One end of the shaft 21 and the shaft 22 are respectively swaged to the lower cover 13, and the other ends of the shaft 21 and the shaft 22 are respectively swaged to the upper cover 14.

In this example, the bimorph 12 and the expansion lever 15 are configured so that the rotary shaft 15a of the expansion lever 15 is disposed on an extension of the line connecting the swinging end and the fixed end of the bimorph 12.

The expansion lever 15 is configured so that the first arm 15e of the expansion lever 15 is substantially perpendicular to the line connecting the rotary shaft 15a and the bimorph clamper 15b. Also, the connecting slot 16b of the blade lever 16 is fitted to the connecting shaft 15c of the expansion lever 15 so that the rotary shaft 16a of the blade lever 16 is disposed on an extension of the line connecting the rotary shaft 15a and the connecting shaft 15c of the expansion lever 15. Furthermore, the blade lever 16 is configured so that the second arm 16c that fixes the blade member 17 is substantially perpendicular to the line connecting the rotary shaft 16a and the connecting slot 16b.

The conditions for defining the cooling apparatus 1 as above will now be described in specific terms. The line connecting the fixed end of the bimorph 12 and the swinging end of the bimorph 12 is a line that connects the portion where the bimorph 12 is fixed to the base member 11 (the axis of the screw 23 on the swinging end side of the bimorph 12) and the portion where the cylinders 15d of the clamper 15b come into contact with the bimorph 12.

The line that connects the rotary shaft 15a of the expansion lever 15 and the bimorph clamper 15b of the expansion lever 15 is a line that connects the axis of the rotary shaft 15a (the axis of the shaft 21) with the midpoint between the two cylinders 15d. The midpoint of the two cylinders 15d is the midpoint between the portion where one cylinder 15 comes into contact with the bimorph 12 and the portion where the other cylinder 15 comes into contact with the bimorph 12.

The line that connects the rotary shaft 15a of the expansion lever 15 and the connecting shaft 15c of the expansion lever

15 is a line that connects the axis of the rotary shaft 15a (the axis of the shaft 21) and the axis of the connecting shaft 15c.

Further, the line connecting the rotary shaft 16a of the blade lever 16 and the connecting slot 16b of the blade lever 16 is a line that connects the axis of the rotary shaft 16a (the axis of the shaft 22) and the center of the connecting slot 16b of the blade lever 16 (the axis of the connecting shaft 15c).

With this configuration, the bimorph 12, the expansion lever 15, the blade lever 16, and the blade member 17 are laid out in an approximate C shape. The bimorph 12 and the blade member 17 are substantially parallel. This layout affords an extremely compact cooling apparatus 1.

1-3: Configuration of Intake to Cooling Apparatus

A discharge port 18a (an example of an opening) of a duct 18 is disposed near the blade member 17 on the proximal end side (fixed side) of the blade member 17. In other words, the discharge port 18a of the duct 18 is disposed near a part of the blade member 17 which swings with the smaller swing angle than center part in the lengthwise direction of the blade member 17.

More specifically, the discharge port 18a of the duct 18 is disposed to the side of the blade member 17 over a range from a position that is in the approximate middle of the blade member 17 to the rotary shaft 16a of the blade lever 16, in the lengthwise direction of the blade member 17. Furthermore, an intake port 18b of the duct 18 opens to the outside of the housing of an electronic device (not shown), or to a corresponding atmosphere.

When the bimorph 12 is driven to swing by AC power, the blade member 17 begins a fanning motion at the surface layer of the heat generator 19 (such as an electronic part). At this point, the flow of air produced by fanning, such as an air flow 30 moving away from the blade member 17, is generated over a range from a position that is in the approximate middle of the blade member 17 in the lengthwise direction to the distal end side. Meanwhile, an air flow 31 toward the blade member 17 is generated over a range from a position that is in the approximate middle of the blade member 17 in the lengthwise direction to the rotary shaft 16a of the blade lever 16. In other words, the air flow 31 in this case is a flow that draws air in, and pulls air near the rotary shaft 16a toward the blade member 17. Therefore, this pulling flow 31, that is, intake flow, causes cooled outside air to be taken in through the duct 18. Also, the cooled outside air is taken in not only through the duct 18, but also from around the blade member 17. This makes it possible to pull the cooled outside air, namely, the air flow 31, to the proximal end side of the blade member 17, and to carry this cooled outside air, namely, the air flow 30, out from the distal end side of the blade member 17. Specifically, the blade member 17 cools the surface layer of the heat generator 19.

The phrase "proximal end side of the blade member 17" as used here corresponds to a range from a position that is in the approximate middle of the blade member 17 in the lengthwise direction to the rotary shaft 16a of the blade lever 16. The "distal end side of the blade member 17" is a phrase that corresponds to a range from a position that is in the approximate middle of the blade member 17 in the lengthwise direction to the distal end side.

Features of Embodiment

The characteristic portions of the above embodiment are listed below. The technology included in the above embodiment is not limited to or by what follows.

(1) The principal drive source of the cooling apparatus is a ceramic actuator, and more specifically a bimorph.

(2) The cooling apparatus in (1) above has at least one expansion mechanism that expands the displacement of the bimorph. In this case, since displacement of the bimorph is amplified (expanded) by the one or more expansion mechanisms, the heat generator can be cooled effectively.

(3) With the cooling apparatus in (1) above, displacement of the bimorph expanded by the expansion mechanism is transmitted to the blade member. As a result, the blade member performs fanning action. Consequently, a heat generator can be effectively cooled without an electronic device being affected by a magnetic flux.

(4) With the cooling apparatus in (1) above, an electronic part or other such heat generator is disposed so as to be substantially parallel to the fanning plane of the blade member. This allows the cooling apparatus to be more compact.

(5) With the cooling apparatus in (1) above, a duct that takes in air whose temperature is lower than that of a heat generator, such as outside air, is provided on the rotational center side based on the approximate center of the blade member. Consequently, even though the cooling apparatus is disposed near the heat generator, the cooling apparatus can blow air with an extremely low temperature onto the heat generator. Specifically, the heat generator can be effectively cooled.

(6) With the cooling apparatus in (1) above, the bimorph serving as the drive source and the blade member that is driven via the expansion mechanism are disposed substantially parallel. This allows the cooling apparatus to be more compact.

(7) With the cooling apparatus in (1) above, the bimorph serving as the drive source, the expansion mechanism, and the blade member are disposed substantially in a C shape. This allows the cooling apparatus to be more compact.

(8) With the cooling apparatus in (1) above, the angle between the input and the output with respect to the rotational center of the expansion mechanism, and the angle between the blade member and the input corresponding to the rotational center of the blade member can be freely set so as to utilize dead space within an electronic device for the bimorph serving as the drive source, the expansion mechanism, and the blade member. This affords greater latitude in the layout of the cooling apparatus. Specifically, this affords greater freedom in the design of the cooling apparatus.

(9) With the cooling apparatus in (1) above, the expansion mechanism and the blade member are held in between two plate members (the lower cover 13 and the upper cover 14). These plate members bond or affix the cooling apparatus to the heat generator. Consequently, the cooling apparatus can be accurately positioned in the interior of the electronic device.

Other Embodiments (A) In the above embodiment, an example was given of using one expansion lever 15, but the number of expansion levers 15 is not limited to that used in the above embodiment, and any number may be used. For instance, vibration of the bimorph 12 may be amplified by using a plurality of expansion levers 15. Here again, the same effect can be obtained as in the above embodiment.

(B) In the above embodiment, an example was given of using the bimorph 12 as a piezoelectric actuator, but some other piezoelectric actuator may be used instead of a bimorph. For instance, a monomorph, a unimorph, or the like may be used as a piezoelectric actuator. Here again, the same effect can be obtained as in the above embodiment.

(C) In the above embodiment, an example was given in which the duct 18 was disposed to one side of the blade member 17, but the duct 18 may be disposed on both sides of the blade member 17. In this case, the same effect can be obtained as in the above embodiment, and the cooling effect can be further enhanced.

General Interpretation of Terms

In understanding the scope of the present disclosure, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiment(s), the following directional terms "forward", "rearward", "above", "downward", "vertical", "horizontal", "below" and "transverse" as well as any other similar directional terms refer to those directions of a cooling apparatus. Accordingly, these terms, as utilized to describe the present technology should be interpreted relative to a cooling apparatus.

The term "configured" as used herein to describe a component, section, or part of a device implies the existence of other unclaimed or unmentioned components, sections, members or parts of the device to carry out a desired function.

The terms of degree such as "substantially", "about" and "approximately" as used herein mean a reasonable amount of deviation of the modified term such that the end result is not significantly changed.

While only selected embodiments have been chosen to illustrate the present technology, it will be apparent to those skilled in the art from this disclosure that various changes and modifications can be made herein without departing from the scope of the technology as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further technologies by the applicant, including the structural and/or functional concepts embodied by such feature(s). Thus, the foregoing descriptions of the embodiments according to the present technology are provided for illustration only, and not for the purpose of limiting the technology as defined by the appended claims and their equivalents.

INDUSTRIAL APPLICABILITY

The present technology can be applied to an electronic device. More specifically, it can be applied to digital still cameras, movie cameras, and other such small electronic devices.

What is claimed is:

1. A cooling apparatus, comprising:
a base member;
a first end of a flat piezoelectric actuator configured to be connected to the base member;
at least one expansion mechanism configured to be connected to a second end of the piezoelectric actuator and pivot by the swinging of the piezoelectric actuator;
a blade member configured to be connected to the expansion mechanism and swing by the pivoting of the expansion mechanism; and
a blade lever configured to connect the expansion mechanism with the blade member, wherein
the blade member performs a fanning action by the swinging of the piezoelectric actuator and the pivoting of the expansion mechanism if AC power is applied to the piezoelectric actuator,
the flat piezoelectric actuator, the expansion mechanism, the blade member, and the blade lever are disposed in a same first plane,
the expansion mechanism is supported so as to be rotatable relative to the base member around a first axis, the first axis being perpendicular to the first plane, and
the blade lever is supported so as to be rotatable relative to the base member around a second axis, the second axis being perpendicular to the first plane.

2. The cooling apparatus according to claim 1, wherein a second plane in which the piezoelectric actuator swings is the same as or parallel to a third plane in which the blade member swings.

3. The cooling apparatus according to claim 1, wherein the piezoelectric actuator and the blade member are disposed substantially parallel.

4. The cooling apparatus according to claim 1, wherein the piezoelectric actuator is a piezoelectric ceramic plate, and
the piezoelectric actuator is constituted by any one of a monomorph, a unimorph, or a bimorph.

5. The cooling apparatus according to claim 1, further comprising:
a duct member disposed near the blade member, wherein
an opening part of the duct member is disposed near a part of the blade member which
swings with a smaller swing angle than the center part of the blade member.

6. The cooling apparatus according to claim 1, wherein the expansion mechanism is constituted by an insulator.

7. The cooling apparatus according to claim 1, wherein, the first end of the flat piezoelectric actuator and the second end of the flat piezoelectric actuator are located at opposite ends of the piezoelectric actuator.

\* \* \* \* \*